US005627900A

United States Patent [19]

Wooley et al.

[11] Patent Number: 5,627,900

[45] Date of Patent: *May 6, 1997

[54] OPTICAL DATA CARDS FOR OPERATING SOUND SYNTHESIZER SYSTEM

[75] Inventors: Gene W. Wooley, Moorpark, Calif.; Anthony P. Van de Ven, Hong Kong; John A. Dackombe, Lantau Island, both of Hong Kong

[73] Assignee: JAG Design International Limited, Hong Kong

[ * ] Notice: The term of this patent shall not extend beyond the expiration date of Pat. No. 5,446,791.

[21] Appl. No.: 377,090

[22] Filed: Jan. 24, 1995

Related U.S. Application Data

[63] Continuation of Ser. No. 33,642, Mar. 17, 1993, Pat. No. 5,446,791.

[51] Int. Cl.$^{6}$ ....... G11C 13/04

[52] U.S. Cl. ....... 381/118; 235/474; 235/482; 235/454; 235/494; 84/639

[58] Field of Search ....... 381/118; 84/639, 84/640; 235/494, 454, 474, 482

[56] References Cited

U.S. PATENT DOCUMENTS

| | | | |
|---|---|---|---|
| 2,615,992 | 10/1952 | Flory et al. | 179/100.3 |
| 3,420,940 | 1/1969 | Glass et al. | 84/1.03 |
| 3,632,887 | 1/1972 | Liepp et al. | 179/1 SA |
| 3,632,995 | 1/1972 | Wilson | 235/61.12 N |
| 3,780,271 | 12/1973 | Sharkitt et al. | 235/61.11 E |
| 4,145,945 | 3/1979 | Iyeta | 84/1.18 |
| 4,261,241 | 4/1981 | Gould et al. | 84/1.18 |
| 4,337,375 | 6/1982 | Freeman | 179/1 SA |
| 4,375,058 | 2/1983 | Bouma et al. | 340/146.3 Z |
| 4,437,378 | 3/1984 | Ishida et al. | 84/1.18 |
| 4,439,672 | 3/1984 | Salaman | 235/463 |
| 4,466,801 | 8/1984 | Dittakavi et al. | 434/335 |
| 4,813,330 | 3/1989 | Hines et al. | 84/483 A |
| 4,964,167 | 10/1990 | Kunizawa et al. | 381/52 |
| 5,059,126 | 10/1991 | Kimball | 434/308 |
| 5,294,745 | 3/1994 | Yamauchi et al. | 84/601 |
| 5,446,791 | 8/1995 | Wooley et al. | 381/18 |

OTHER PUBLICATIONS

Michael H. O'Malley, "Text–To–Speech Conversion Technology", Aug., 1990, pp. 17–23.

BeSTspeech Products, Inc., "Data Sheet: The BeSTspeech TTS Output Chip", Jan. 6, 1993.

*Primary Examiner*—Forester W. Isen

*Attorney, Agent, or Firm*—D'Alessandro & Ritchie

[57] ABSTRACT

An optical data storage and retrieval system uses printed cards having a plurality of parallel tracks of contrasting fields representing digital 1's and 0's. A timing track is included as one of the parallel tracks. The card is manually read by a plural parallel track reader indexed to an edge of the card. A stop code, start code, checksum and number of data bytes are included in data stored on the cards. The system can sort the data correctly regardless of whether it is read backwards or forwards Error detection is implemented with a checksum system. Data read from the cards are preferably passed to a voice or sound synthesizer which outputs synthesized voice or sounds responsive to the data stored on the cards.

28 Claims, 4 Drawing Sheets

OPTICAL DATA CARDS FOR OPERATING SOUND SYNTHESIZER SYSTEM

CROSS-REFERENCE TO RELATED APPLICATION

This is a continuation of Patent application Ser. No. 08/033,642, filed Mar. 17, 1993, now U.S. Pat. No. 5,446, 791.

BACKGROUND OF THE INVENTION

1. Field of the Invention This invention relates to the field of optical data storage and retrieval. More particularly it relates to optical storage and retrieval of information to control a voice or sound synthesizer.

2. Description of the Related Art

The optical storage of information for controlling a voice or sound synthesizer is well known. Some systems in the related art scan alphabetic characters and then pronounce them by resurrecting bits of sounds that correspond to those alphabetic characters. More recent systems employ an optical wand to read conventional bar codes and control the synthesizer with information encoded in the bar coded material. While suited for their intended purposes, these systems do not provide a cheap and convenient way of getting lots of data into a voice synthesizer system quickly. Current voice and sound synthesizers require a high data input rate in order to produce a continuous output.

Games, advertisements and other applications which employ a voice or sound synthesizer have a need for relatively large amounts of data to be stored in relatively compact form. Accordingly, a need exists for an improved optical data storage and retrieval system which may be employed to control a voice or sound synthesizer.

SUMMARY OF THE INVENTION

The present invention is directed to an optical data storage and retrieval system which employs flat printed matter ("media") printed with a plurality of parallel tracks of digital data. The parallel tracks comprise fields of contrasting printing, such as black and white, to represent digital data, such as "1"'s and "0"'s. A timing track is included as one of the parallel tracks. The timing track eliminates the need to scan the flat printed matter at a constant rate of speed.

According to one aspect of the present invention, the timing track includes an evenly spaced repeating mark and at each occurrence of the mark, the other data in the parallel tracks above and/or below the mark represent a byte of digital data.

According to another aspect of the present invention, a "stop" code is included in the final data byte contained on the media, a "start" code is included in the first byte and one or more bytes represent the number of data bytes contained in the media.

According to another aspect of the present invention, a cyclic redundancy check, checksum, or other error checking method is used to determine data integrity after reading the media.

According to another aspect of the present invention, a multi-track optical scanner utilizing physical indexing to determine the position of the parallel tracks is used to read the digital data contained in the media.

According to another aspect of the present invention, the media is manually wiped through the scanner and the scanner determines its timing from a timing track contained on the media.

According to another aspect of the invention, "stop" code, "start" code and number of data bytes may be read by the scanner. Additionally error detection and/or error correction may be included in the scanner such as by employing cyclic redundancy checking and/or checksum-type error checking systems.

According to another aspect of the present invention, data bytes read from the media are converted to synthesizer commands and transmitted to a synthesizer for generating synthesized speech or sounds responsive to data contained on the media.

Other and further objects and advantages of the present invention will appear hereinafter.

DESCRIPTION OF THE PREFERRED EMBODIMENTS.

The optical data storage and retrieval system preferably comprises a scanner unit 10 and printed cards or "media" 20 scannable by unit 10. Unit 10 includes sensors, control switches, display lights, an audio output system and a processor package.

Figure 1:
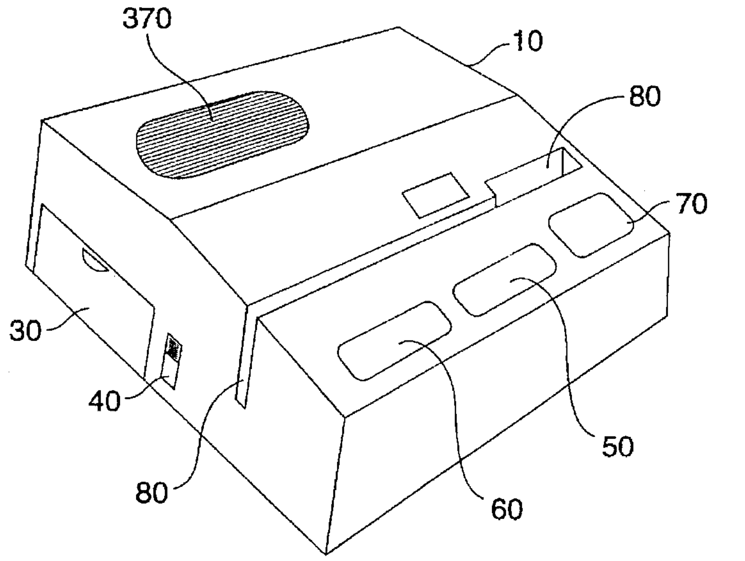
FIG. 1 is a front perspective view of the scanner unit.
Figure 2:
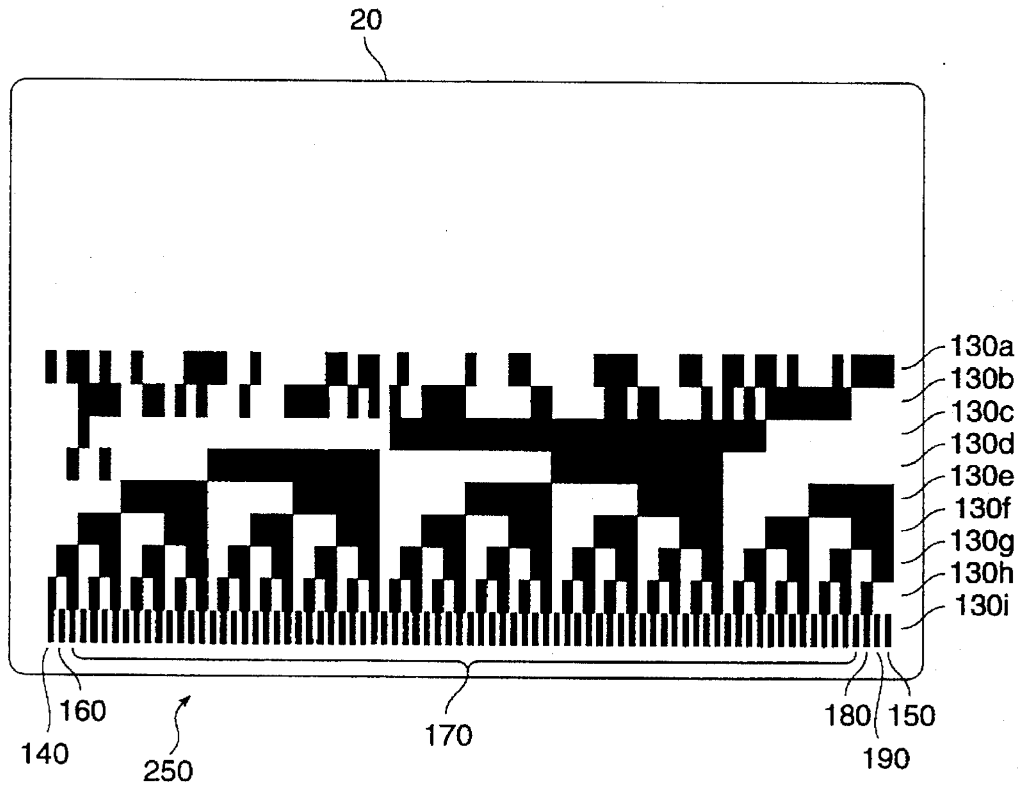
FIG. 2 is a diagram of a data storage card ("media").

Turning to FIG. 1, according to a preferred embodiment of the present invention, scanner unit 10 preferably powered by batteries or an AC/DC adapter is provided. Unit 10 comprises an optical scanner and a voice and/or sound synthesizer. The optical material to be read is contained on readable cards 20 (FIG. 2) which are sometimes referred to herein as "media". Batteries are preferably kept in battery compartment 30. An on/off switch 40 is provided.

The operation of Unit 10 will now be described with reference to the flow chart at FIG. 6. When powered on, unit 10 performs a power on self test 380 to determine that all its internal functions are operating correctly. The first check is preferably of the batteries, if present. If the batteries are low 390 then unit 10 illuminates its BATT LOW lamp 50. If the batteries have an adequate charge then unit 10 checks its other circuits including the sensors—with and without illumination, the data validity of the memory circuits, the data retention of the RAM 280, and verifies that the audio decode circuitry is operating.

If a problem is detected during the power on self test, unit 10 blinks its Error Lamp 60 in a sequence of blinks 400 and pauses to indicate the type of problem. For example, a repeating sequence of: 3 blinks followed by a pause—repeating—may indicate a problem with RAM 280. In addition to this blink-type diagnosis, unit 10 may be programmed to play an audio message 410 outlining the problem and possibly also give procedural information for service. The unit then halts 420.

If unit 10 has detected no problem during the power on self test it may then play an instructional message 430 if required. For example it could play "Hi, I'm fully functional, please swipe through your card" or the equivalent. After this unit 10 will preferably enter a power down standby mode 440 awaiting an action from the user. Standby mode is provided to prolong the battery life by powering down all unnecessary circuitry.

Unit 10 can be re-activated again by one of 3 user actions:

1. Switching unit 10 off then ON again with switch 40—this will cause unit 10 to repeat the above initialization procedure and go to STANDBY again.

2. Press AGAIN button 70 (450 in FIG. 6)—this will cause the unit to replay the last audio message. This could be an error message, or the instructional message or the last message as swiped through. If there was no previous message the unit can respond by saying "No message to re-play". After playing the message the unit returns to STANDBY mode 440.

3. Inserting card 20 into reader slot 80 (460 in FIG. 6)—Inserting card 20 into slot 80 causes the depression of "leaf" tracking spring 90 (FIG. 3) and this closes plunger 100 of triggering micro switch 110. The closing of micro-switch 110 re-activates the unit's other circuitry 470 thereby taking it out of STANDBY mode. This is a trigger on input action and removal of the card doesn't necessarily place the unit back into STANDBY mode.

Figure 6:
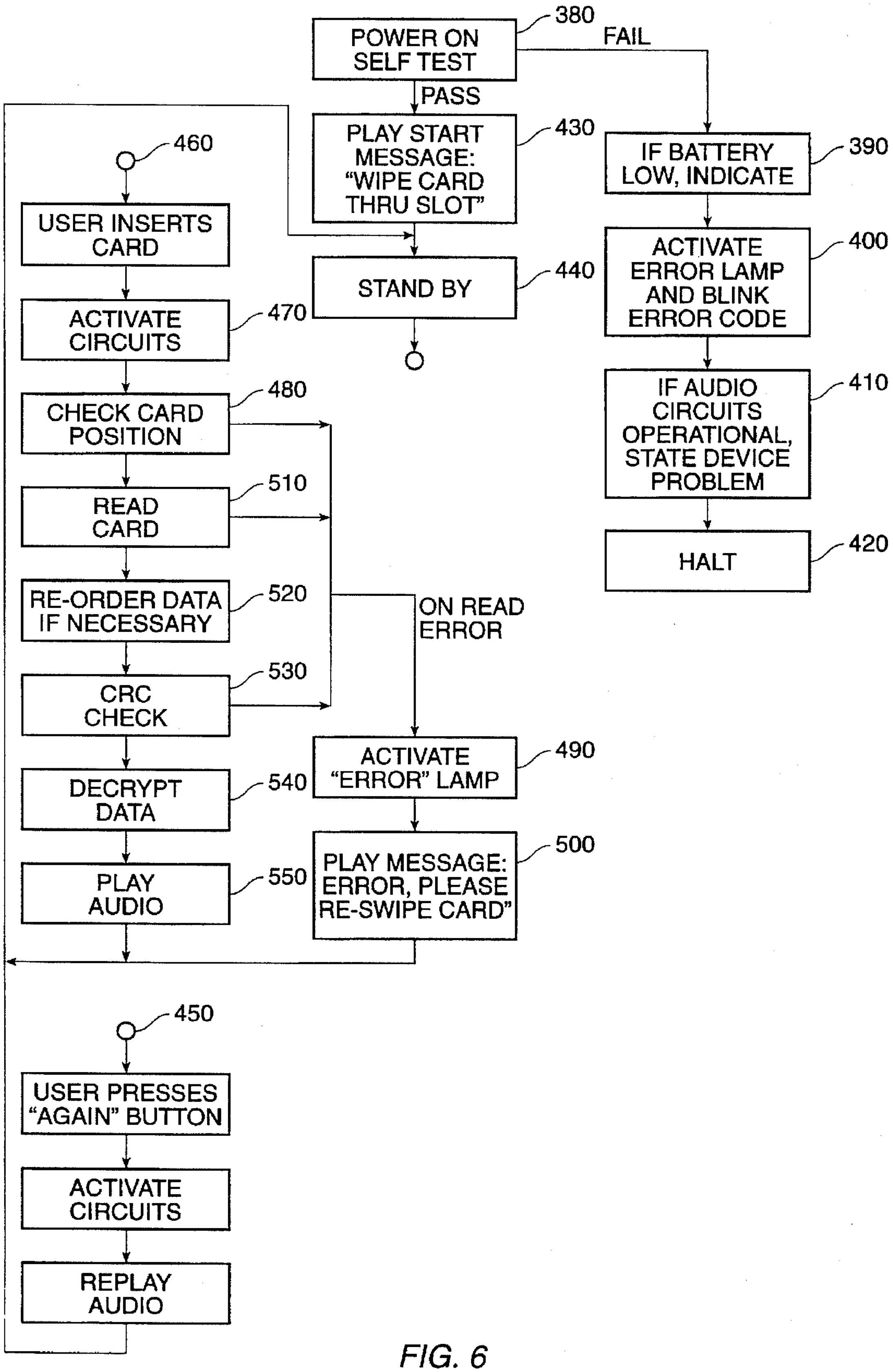
FIG. 6 is a software flow diagram of the software controlling the scanner unit.

Unit 10 then checks to ensure that card 20 is correctly positioned in slot 80 (480 in FIG. 6). This is done by checking that all the sensors are reading "white space"—i.e., no data. If a sensor detects data or "black space", indicating the card is in the wrong initial position unit 10 activates error lamp 60 (490 in FIG. 6) and may play a message such as "Error—Please position card at the end of the slot" 500. After this error it would return to STANDBY mode 440.

Assuming the card is correctly positioned, the user would preferably slide it right to left in slot 80 as shown in FIG. 1. From the user's perception the insertion and sliding can be one continuous motion. Unit 10 reads the data off card 20 (510 in FIG. 6) with its 8 top data sensors **120*a*–120*h* in 2 step process by first reading the status of the bottom sensor 120*i* (the clock synchronization pick-up sensor) and using this varying signal status to synchronize when to correctly read the other 8 sensors 120*a*–120*h***.

How The Data Is Stored On Card 20

The data is arranged on card 20 in vertical stripes of data bytes. There are 9 horizontal tracks of data **130*a*–130*i* which are respectively scanned and read by sensors 120*a*–120*i*. Each data byte has an associated clock bit—preferably the bottom bit contained in horizontal timing track 130*i* although another track or tracks could be used. By monitoring the bottom (clock) sensor 120*i* unit 10 can determine when to read and store the associated 8 data bits from tracks 130*a*–130*h*. These data bits are then stored as an 8-bit byte in the RAM 280. As card 20 is wiped through slot 80 each consecutive byte is stored sequentially in memory until all the data on the card is read. The first and last bytes of data are given a predetermined unique code to indicate the start and end. Thus unit 10 can determine which of the two is the start byte and which is the stop byte and appropriately rearrange the data 520 if it was scanned backwards. Start byte 140 and stop byte 150 are shown on FIG. 2**.

Read Failure Detection

If during the swiping process 510 card 20 is stopped or removed from slot 80, unit 10 it detects this by detecting a cessation of the activity of clock sensor **120*i*. Should this occur, unit 10 will then activate its error indicator 60** and may play an audio error message such as "Error—Please re-swipe card".

Data Orientation

Once card 20 has been swiped through completely and the data successfully read unit 10 then determines in which order the data was read by checking the relative position of start byte 140 and end byte 150. If card 20 was swiped through backwards then unit 10 re-orders its sequential data in memory to the correct sequence 520.

The data in memory will then consist of first a start byte 140 followed by a count byte 160 which contains the number of data bytes in the sequence (0–511), followed by data bytes 170, followed by two bytes 180, 190 containing a checksum for data bytes 170 and finally stop byte 150.

Error Detection

The unit now performs a check on the data by using a conventional cyclic redundancy check type software algorithm 530 to determine the checksum of data bytes 170. The calculated checksum value is then compared to the value in the second and third to the last bytes of the string 180, 190.

If the values are different then the data is invalid and a read error has occurred. The unit will in this case illuminate error lamp 60 and may play an audio message such as "Read error—please re-swipe card".

If the checksum values are equal unit 10 will then decrypt the data portion 170 of the string and store this as the final data string to pass to the audio decoder 540.

Each byte of the sound string is passed to the audio decoder in a sequential manner. Included in the ROM 290 are software routines to determine the timing, order and sounding characteristics of each byte of the sound string and this data is also passed to the audio decoder.

The audio decoder consolidates all this data and processes it into an audio frequency AC signal which it outputs through a pair of pins as a differential signal. This signal is amplified, filtered and then amplified again prior to playing as sound on the speaker 550.

After the audio message corresponds to the data bytes 170 has been played unit 10 returns to STANDBY mode 440. The message can be replayed by either wiping card 20 through slot 80 again (460) or by pressing the AGAIN button 70 (450).

The Sensors

Figure 4:
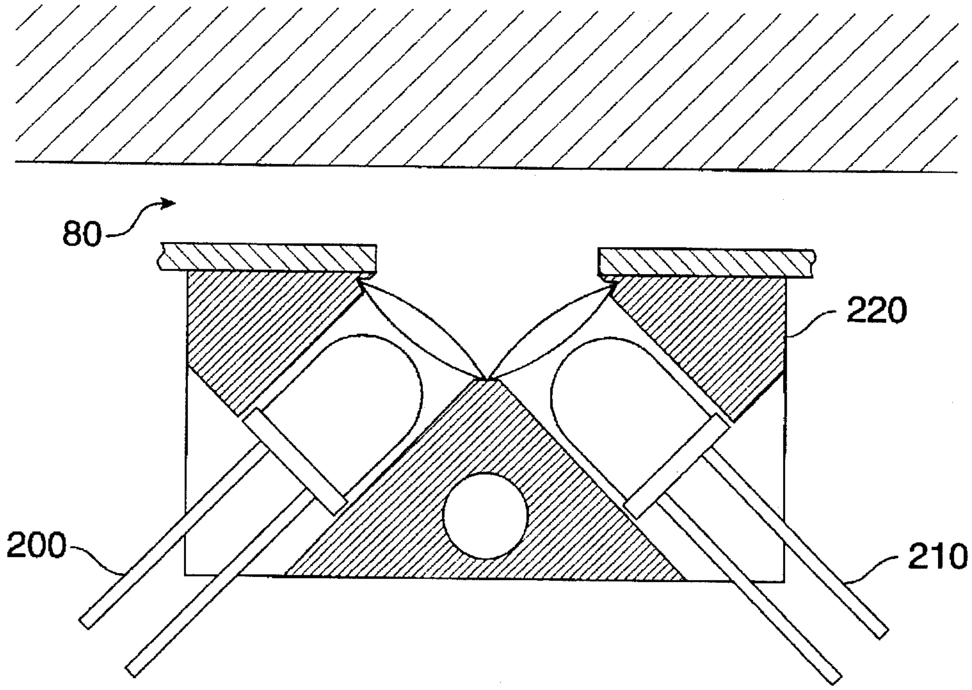
FIG. 4 is a diagram of one scanner element of the scanner array.

The sensors **120*a*–120*i* are optical sensors. One is shown at FIG. 4. They consist of photo-darlington transistors 200. Each sensor gives a current output proportional to the amount of light presented to the sensor. Associated with the sensors are a series of illuminating LED light sources 210. These illuminate card 20 so that sensors 120*a*–120*i*** can read the it.

When unit 10 is to read card 20 it activates the illuminating LED light sources 10 which flood the portion of the card in slot 80 in front of the sensor assembly 20 with light. After a few micro-seconds delay unit 10 then reads the output of the photo-transistors. If the portion of card 20 in front of a sensor 200 is reflective (e.g., white) then the unit will read a digital "1" and if the portion of card 20 in front of a sensor 200 is non-reflective (e.g., black) then the unit will read a digital "0". After unit 10 has recorded in memory the value of each of the sensors **120*a*–120*h* it then turns the illuminating LED light sources 210** off. This whole process can be done within 5–10 microseconds.

Figure 3:
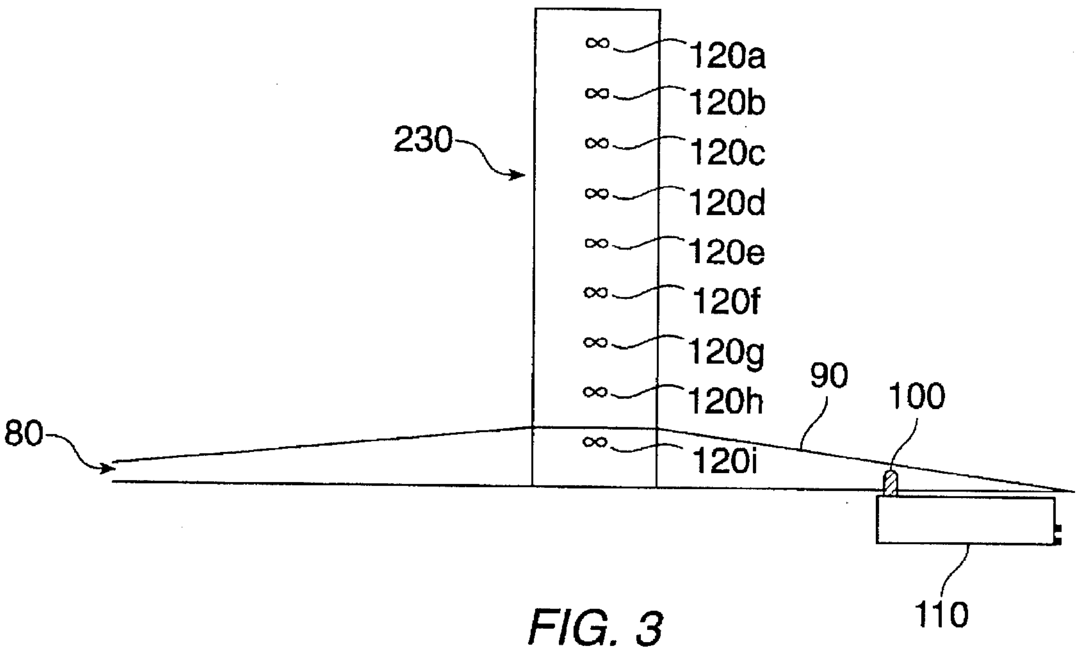
FIG. 3 is a diagram of the scanner array of the scanner unit.

Mechanically sensors 120a–120i are grouped together in a vertical stack arrangement as shown in FIG. 3 at 230. They are attached to "leaf" spring 90 which is normally curved up as shown in FIG. 3. Leaf spring 90 forms the bottom of card slot 80. The vertical distance between the top of the center 240 of leaf spring 90 and the center of the bottom sensor 120i is preferably made equal to the vertical distance between the bottom edge 250 of card 20 and the vertical center of the bottom horizontal data track ("clock track" or "timing track") 130i. The other data sensors 120a–120h are arranged above sensor 120i so that they align with the vertical centers of the horizontal data tracks 130a–130h as printed on card 20.

Inserting card 20 in slot 80 causes bottom edge 250 to rest on leaf spring 90 and depress it. As card 20 is moved through slot 80 leaf spring 90 presses against bottom edge 250 of card 20 and as it is attached to sensors 120a–120i it causes sensors 120a–120i to track accurately the vertical centers of the data bits as recorded on the cord. This physical indexing system relative to the straight bottom edge 250 of card 20 makes it possible to read a plurality of parallel horizontal data tracks 130a–130i on card 20 simultaneously resulting in a relatively high data input rate. Other physical indexing systems and card-in-slot detection systems could be used. For example, a button in the well of slot 80 aligned with sensors 120a–120i could activate a switch much like microswitch 110. A coil spring could bias the button upward and thereby provide an upward bias to card 20.

Processor Package

Although any number of configurations of hardware could be used to implement the optically controlled synthesizer, the presently preferred embodiment is now described. A block/schematic diagram of the processor package is set forth at FIG. 5. A microprocessor 260 such as a Z-80, V20, or similar type manages all input and output functions. Microprocessor 260 is preferably equipped with an external oscillator crystal 270. RAM 280 is provided for intermediate storage of data read from card 20 with sensors 120a–120i and ROM 290 is provided to store pre-programmed instructions to control microprocessor 260. An address bus 300 and data bus 305 are provided to link RAM 280 and ROM 290 to microprocessor 260 as is well known in the art. An audio decoded synthesizer chip 310 is connected to microprocessor 260 with a data bus 315 and a control signal bus 320. Chip 310 may be a BESTspeech T-T-S chip with on-board ROM. Such chips are available from Berkeley Speech Technologies, Inc., 2246 Sixth Street, Berkeley, CA 94710.

The microprocessor software, after decoding the data codes into an ASCII string, which in one preferred embodiment is a text string, passes an address pointer to another software routine (available for control of the BESTspeech T-T-S chip from Berkeley Speech Technologies, Inc.) ("replay routine") which is provided as an adjunct to the sound decoder chip 310. The address pointer points to the first character byte of the data string which was read from the media. The "replay routine" then checks the relative positions of characters in the string and other grammatical content as well as combing in embedded control codes and then passes a series of data bytes at predetermined intervals to the sound decoder IC 310 so that the sound is then replayed through the speaker. This is one embodiment of a text-to-speech synthesizer. Many others are known in the art and could be used as substitutes herein. It is also to be understood that this invention is not to be limited to text-only synthesis as non-speech sound synthesis is also supported by the sound decoder 310.

Differential signal preamplifier 330 amplifies an audio signal appearing as a differential signal on 2 pins of chip 310. Audio filter 340 filters the pre-amplified audio signal and amplifier 350 drives speaker 370 under the volume control of potentiometer 360. Optionally Digital Signal Processing techniques, as well known in the art, may be used to further process and massage the audio signal prior to amplification.

Figure 5:
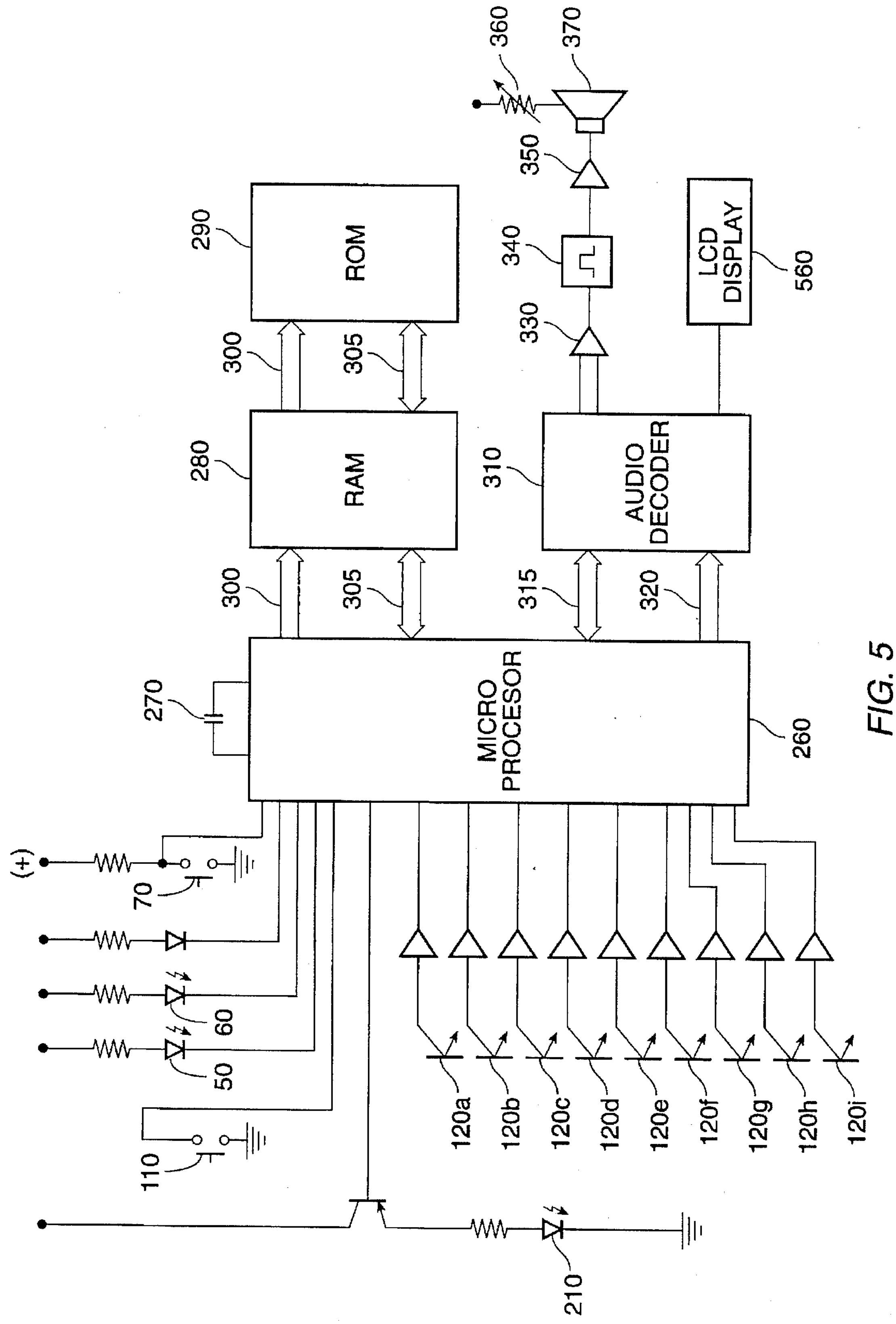
FIG. 5 is a block/schematic diagram of the processor package.

An optional feature shown in FIG. 5 at 560 may also be incorporated. An LCD or other visually perceivable display device may also be incorporated to provide a visually perceivable display of the information read from card 20. In a preferred embodiment, the visual display 560 may be an LCD panel display. Other display means could be used as well, such as CRT displays and the like. In a preferred embodiment, the text read from card 20 may be processed by decoder chip 310 which preferably includes an output suitable for providing text output to LCD display 560. In this manner, LCD display 560 would display visually what is being "played" audibly by the synthesizer, at least insofar as what is being "played" is text. It is also possible to have the microprocessor 260 directly drive display 560.

In a further preferred embodiment of the present invention, decoder chip 310 also includes the ability to store and play back sampled or pre-recorded sounds. According to this preferred embodiment, certain data, stored in data bytes of card 20, could trigger the playback of predetermined sampled sounds previously stored on decoder chip 310 (or on auxiliary devices addressed by decoder chip 310 or microprocessor 260) in addition to the playback of text and/or sounds by decoder chip 310.

While embodiments and applications of this invention have been shown and described, it would be apparent to those of skill in the art that many more modifications are possible without departing from the inventive concepts herein. The invention, therefore, is not to be restricted except in the spirit of the appended claims.

What is claimed is:

1. A card for optical reading by a card reader of a card-programmed sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes being a stop byte, said columns intersecting each of said plurality of parallel data tracks and corresponding to a timing mark on said timing track, the bits of said data byte, for each said track other than said timing track, determined by whether a mark or space is disposed in said column.

2. A card for optical reading by a care reader of a card-programmed sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformity spaced marks and spaces, said marks and spaces representing stored digital signals, said digital signals being formed of a successive plurality of data bytes, each of said data bytes represented on said card in columns orthoganal to said edge, at least one of said data bytes being a start byte, said columns intersecting each of said plurality of parallel data tracks and corresponding to a timing mark on said timing track, the bits of said data byte, for each said track other than said timing track, determined by whether a mark or space is disposed in said column.

3. A card for optical reading by a card reader of a card-programmed sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes comprising a checksum, said columns intersecting each of said plurality of parallel data tracks and corresponding to a timing mark on said timing track, the bits of said data byte, for each said track other than said timing track, determined by whether a mark or space is disposed in sàid column.

4. A card for optical reading by a card reader of a card-programmed sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes comprising a count of the total number of data bytes stored thereon, said columns intersecting each of said plurality of parallel data tracks and corresponding to a timing mark on said timing track, the bits of said data byte, for each said track other than said timing track, determined by whether a mark or space is disposed in said column.

5. A card according to claim 1 wherein at least one of said data bytes is a start byte.

6. A card according to claim 1 wherein at least one of said data bytes comprises a checksum.

7. A card according to claim 1 wherein at least one of said data bytes comprises a count of the total number of data bytes stored thereon.

8. A card according to claim 2 wherein at least one of said data bytes comprises a checksum.

9. A card according to claim 2 wherein at least one of said data bytes comprises a count of the total number of data bytes stored thereon.

10. A card according to claim 4 wherein at least one of said data bytes comprises a checksum.

11. A card according to claim 5 wherein at least one of said data bytes comprises a checksum.

12. A card according to claim 5 wherein at least one of said data bytes comprises a count of the total number of data bytes stored thereon.

13. A card according to claim 8 wherein at least one of said data bytes comprises a count of the total number of data bytes stored thereon.

14. A card according to claim 13 wherein at least one of said data bytes is a stop byte.

15. A machine readable surface for optical reading by a reader of a sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes being a stop byte, said columns intersecting each of said plurality of parallel data tracks and corresponding to a timing mark on said timing track, the bits of said data byte, for each said track other than said timing track, determined by whether a mark or space is disposed in said column.

16. A machine readable surface for optical reading by a reader of a sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes being a start byte, said columns intersecting each of said plurality of parallel data tracks and corresponding to a timing mark on said timing track, the bits of said data byte, for each said track other than said timing track, determined by whether a mark or space is disposed in said column.

17. A machine readable surface for optical reading by a reader of a sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes comprising a checksum, said columns intersecting each of said plurality of parallel data tracks and corresponding to a timing mark on said timing track, the bits of said data byte, for each said track other than said timing track, determined by whether a mark or space is disposed in said column.

18. A machine readable surface for optical reading by a reader of a sound synthesizer system comprising:

a flat surface having disposed thereon a plurality of parallel tracks of digital information, said tracks comprising optically contrasting marks and spaces and each being disposed a fixed distance from an edge of said card, at least one of said tracks being a timing track formed of uniformly spaced marks and spaces, said marks and spaces representing stored digital signals, said digital signals being formed of a successive plurality of data bytes, each of said data bytes represented on said card in columns orthoganal to said edge, at least one of said data bytes comprising a count of the total number of data bytes stored thereon, said columns intersecting each of said plurality of parallel data tracks and corresponding to a timing mark on said timing track, the bits of said data byte, for each said track other than said timing track, determined by whether a mark or space is disposed in said column.

19. A surface according to claim 15 wherein at least one of said data bytes is a start byte.

20. A surface according to claim 15 wherein at least one of said data bytes comprises a checksum.

21. A surface according to claim 15 wherein at least one of said data bytes comprises a count of the total number of data bytes stored thereon.

22. A surface according to claim 15 wherein at least one of said data bytes comprises a checksum.

23. A surface according to claim 16 wherein at least one of said data bytes comprises a count of the total number of data bytes stored thereon.

24. A surface according to claim 18 wherein at least one of said data bytes comprises a checksum.

25. A surface according to claim 19 wherein at least one of said data bytes comprises a checksum.

26. A surface according to claim 19 wherein at least one of said data bytes comprises a count of the total number of data bytes stored thereon.

27. A surface according to claim 22 wherein at least one of said data bytes comprises a count of the total number of data bytes stored thereon.

28. A surface according to claim 27 wherein at least one of said data bytes is a stop byte.

* * * * *

UNITED STATES PATENT AND TRADEMARK OFFICE

CERTIFICATE OF CORRECTION

PATENT NO. : 5,627,900

DATED : May 6, 1997

INVENTOR(S) : Gene W. Wooley, John A. Dackombe, Anthony P. Van De Ven

It is certified that error appears in the above-indentified patent and that said Letters Patent is hereby corrected as shown below:

Column 1, line 8: insert a hard return after "1. Field of the Invention".

Col. 1, line 42, replace "such as "1'"s and "0'"s." with --such as "1"s and "0"s.--.

Col. 4, line 57, replace "10" with --210--.

Col. 4, line 58, replace "20" with --220--.

Col. 5, line 44, replace "decoded synthesizer" with --decoder/synthesizer--.

Claim 2, Column 6, line 57: replace "care" with --card--.

Claim 22, Column 9, line 16: replace "15" with --16--.

Signed and Sealed this

Seventh Day of October, 1997

*Attest:*

BRUCE LEHMAN

*Attesting Officer* *Commissioner of Patents and Trademarks*